United States Patent [19]

Posa

[11] Patent Number: 4,747,367
[45] Date of Patent: May 31, 1988

[54] METHOD AND APPARATUS FOR PRODUCING A CONSTANT FLOW, CONSTANT PRESSURE CHEMICAL VAPOR DEPOSITION

[75] Inventor: John G. Posa, Lake Oswego, Oreg.

[73] Assignee: Crystal Specialties, Inc., Portland, Oreg.

[21] Appl. No.: 873,582

[22] Filed: Jun. 12, 1986

[51] Int. Cl.$^4$ ............................................. C23C 16/00
[52] U.S. Cl. .................................... 118/715; 118/725; 118/50.1
[58] Field of Search ...................... 118/50.1, 723, 715, 118/725; 156/345

[56] References Cited

U.S. PATENT DOCUMENTS

| | | | |
|---|---|---|---|
| 3,306,768 | 2/1967 | Peterson . | |
| 3,652,444 | 2/1972 | Lester et al. . | |
| 3,850,679 | 11/1974 | Sopko et al. . | |
| 4,066,481 | 1/1978 | Manasevit et al. . | |
| 4,279,670 | 7/1981 | Steele . | |
| 4,369,031 | 1/1983 | Goldman et al. . | |
| 4,401,507 | 8/1983 | Engle | 118/723 |
| 4,435,445 | 3/1984 | Allred | 427/86 |
| 4,446,817 | 5/1984 | Crawley . | |
| 4,476,158 | 10/1984 | Baumberger et al. . | |
| 4,592,307 | 6/1986 | Jolly | 118/725 |
| 4,615,298 | 10/1986 | Yamazaki | 118/725 |
| 4,615,909 | 10/1986 | Thijssen | 118/725 |
| 4,651,673 | 3/1987 | Muething | 118/725 |

OTHER PUBLICATIONS

Dapkus, P. Daniel, "Metal Organic Chemical Vapor Deposition," Annual Review of Material Sciences, vol. 12 (1982) 243, 269.

Westphal et al., "A Flow Channel Reactor for GaAs Vapor Phase Epitaxy," Journal of Crystal Growth, vol. 56 (1982) 324–331.

Weitzel et al., "A Comparison of GaAs and Si Processing Technology," Semiconductor International (Jun. 1982) 73–89.

Johnsen, Gregory, "Gallium Arsenide Chips Emerge from the Lab," High Technology (Jul. 1984) 44–52, page titled "Resources".

Korde, R. S., "Some Notes on the Current Aspects of MOCVD," 2 pages.

Brody, Herb, "Ultrafast Chips at the Gate," High Technology (Mar. 1986) 28–34, 70.

Primary Examiner—Richard R. Bueker
Attorney, Agent, or Firm—Klarquist, Sparkman, Campbell, Leigh & Whinston

[57] ABSTRACT

Apparatus for producing a constant flow, constant pressure chemical vapor deposition includes a manifold having inlet valves for simultaneously switching equal flows of reactive and nonreactive gas between a process chamber and a vent chamber. A constant flow through the process chamber during a deposition is maintained by replacing each reactive gas flow with the equal nonreactive gas flow. Substantially equal pressures within each chamber are maintained by the substantially equal flows of gases. Any "dead space" within the manifold downstream of the inlet valves is minimized by use of a radial manifold. The nonreactive gas flows also purge the "dead space" of reactive gas that may linger after its flow is switched to the vent chamber.

15 Claims, 4 Drawing Sheets

METHOD AND APPARATUS FOR PRODUCING A CONSTANT FLOW, CONSTANT PRESSURE CHEMICAL VAPOR DEPOSITION

RELATED APPLICATION DATA

This application is related to application Ser. No. 873,581, entitled METHOD AND APPARATUS FOR DEPOSITING MATERIAL ON A SUBSTRATE, filed contemporaneously herewith.

BACKGROUND OF THE INVENTION

This invention relates to a method and apparatus for depositing material on a substrate using a chemical vapor deposition process. More particularly, the invention relates to such a method and apparatus for producing multilayered structures of extreme thinness and sharp transitions between layers.

Chemical vapor deposition processes have long been used for depositing material on a substrate, such as in the fabrication of semiconductor devices. One such process, metalorganic chemical vapor deposition (MOCVD), is preferred for the fabrication of many high performance electronic and optoelectronic devices because it can utilize aluminum, which the other processes cannot do. In addition, the inherent characteristics of metalorganic chemical vapor deposition make it ideally suited for growing epitaxial layers, which are inevitably involved in new device structures.

In the growth process with metalorganic chemical vapor deposition, one or more film constituents are transported to a reaction zone in a form of gaseous reactants. The metalorganic reactant is contained in a bubbler through which a carrier gas is bubbled to vaporize the metalorganic for transport to the reaction zone. The desired compound forms as a layer on the substrate via the pyrolysis of the reactants and the subsequent recombination of the atomic or molecular species on the heated substrate. The growth process can be controlled by fixing the flow rates and thereby relative proportions of the various gaseous reactants with electronic mass flow controllers. Complex, multilayer epitaxial structures are formed by exchanging one gas composition for another using conventional gas-mixing systems.

Current chemical vapor deposition apparatus, commonly known as reactors, include a deposition chamber or vessel for housing the substrate, a gas mixing manifold, and a heat source such as an inductively coupled RF generator. The chamber is typically one of two configurations: a vertical bell jar usually employed for commercial, high volume production and a horizontal cylindrical tube preferred for research. A graphite susceptor for supporting the substrate is mounted in the chamber for positioning the substrate at a desired angle to the reactive gas flow. Examples of such chambers are disclosed in U.S. Pat. Nos. 3,306,768 to Peterson, 3,850,679 to Sopko et al., 4,066,481 to Manasevit, 4,369,031 to Goldman et al., 4,446,817 to Crawley, and in P. Daniel Dapkus, "Metal Organic Chemical Vapor Deposition," *Annual Review of Material Sciences* 1982, Vol. 12, pp. 243, 269.

One drawback of these conventional chamber designs is their inability to concentrate the flow of reactants near the surface of the substrate. The relatively large volume of the chamber encourages a turbulent flow of the gases from the chamber's inlet to its outlet, leading to a nonuniform deposition. The large volume also results in a low velocity of gas flow across the substrate, causing further nonuniformity in the deposition as the reactants deposit at the leading edge of the substrate.

The second component of most deposition apparatus, the gas-mixing manifold, directs gas flow from a number of sources into the chamber. The conventional manifold is typically a linear array of gas flow lines constructed from stainless steel tubing, connecting the various gas sources to the chamber inlet. Inlet valves are positioned in the flow lines for sequentially introducing different reactive gases into the chamber. An electronic mass flow controller controls the flow of gas in each line. The mass flow rates and sequencing of the valves are controlled by a central processor, which automates the growth of complex multilayer material structures.

The conventional manifold, although adequate for producing less advanced devices, cannot control reactive gas flows accurately enough to produce the sharp transitions in composition between layers demanded by today's high speed solid-state devices. The reactive gases tend to linger in any "dead space" or volume of the manifold downstream of the respective inlet valve. These gases gradually disperse into the chamber to contaminate the following deposition layer. The result is a gradual rather than sharp transition between layers. The manifold of Peterson, for example, employs flow meters and valves to control each reactive gas flow, but between the valves and the process chamber is a large volume from which reactants can disperse into the chamber even after the flow is shut off by the flow meter. The same drawback is apparent in other apparatus such as that of Sopko et al. and Manasevit, both of which use a linear manifold for injecting the reactive gases into the chamber. The inlet valve in each gas line is located a different distance from the outlet of the manifold, compounding the problem because the volume of "dead space" for each reactive gas differs. Other manifolds with similar drawbacks are disclosed in Goldman et al., Crawley, U.S. Pat. Nos. 4,279,670 to Steele, and 4,476,158 to Baumberger et al.

Much development in chemical vapor deposition has concentrated on improving the deposition method. Peterson, one of the earliest patents in the field, is directed to a process for coating a substrate with an oxide film while keeping the substrate at a relatively low temperature. Sopko et al. is directed to a method of coating a substrate by vaporizing the reactant and directing it through a nozzle against the substrate.

These and the other methods, however, have not been able to control precisely the uniform thickness of the deposited layers because they do not maintain a constant flow and thus a constant pressure through the process chamber. Constant flow and pressure are difficult to maintain in the face of the continuous switching of different reactants into and out of a chamber. Each reactive gas may have a different flow rate requiring compensating change in flow elsewhere to maintain a constant total gas flow into the process chamber. Pressure can also build in gases that are held behind closed valves, causing flow surges when the gas is eventually switched into the chamber. This pressure buildup is especially a problem in the MOCVD process, where pressure buildup within the bubbler can cause large bubbles to form and disrupt the reactive gas flow. The apparatus disclosed in Manasevit minimizes this pressure surge somewhat by directing gas flows to an exhaust rather than terminating them when they are not called for in the deposition process. However, Manasevit does not compensate for the effect of a varying reactive gas flow on the uniformity of deposition.

SUMMARY OF THE INVENTION

An object of the invention, therefore, is to provide an improved method and apparatus for depositing material on a substrate using a chemical vapor deposition process.

Another object of the invention is to minimize the adverse effect of "dead space" within the apparatus.

A further object of the invention is to purge the apparatus of any lingering reactive gas before deposition of a successive layer.

Another object of the invention is to control precisely the sharpness of transitions at a heterojunction between layers and the layer thicknesses.

Another object of the invention is to maintain a constant flow of gases through the deposition chamber to produce uniform deposition on the substrate.

Yet another object of the invention is to maintain a constant pressure in the deposition chamber as gases are switched into and out of the apparatus during the deposition process.

To achieve these objects, an apparatus according to the invention includes a process chamber, a plurality of gas sources each providing a gas flow, and a manifold means for directing gases selectively from the gas sources to the process chamber. The manifold means has first and second inlets for receiving gases from the gas sources, an outlet to the process chamber in communication with the inlets, and a vent in communication with the inlets. The apparatus also includes jointly operable inlet valve means for simultaneously switching the gas flows back and forth between the outlet and the vent. The apparatus may also include means for maintaining a constant gas flow into the process chamber as the gas flows are switched between the outlet and vent.

In one aspect of the invention, the apparatus includes a vent chamber in communication with both the vent and the process chamber. The vent chamber is maintained at a pressure substantially equal to that of the process chamber to minimize flow surges as gas flows are switched into and out of the process chamber. Preferably, the vent chamber is disposed annularly around the process chamber and communicates with the process chamber at a common outlet thereof.

In another aspect of the invention, the inlet valve means are located equidistantly from the manifold outlet such as in a radial manifold.

The method of the invention includes providing a constant flow of gas at a constant pressure in the process chamber to improve the uniformity of deposition on the substrate. This method includes injecting at least one reactive gas flow into the process chamber at a predetermined, constant rate. As a deposition layer is completed, the reactive gas no longer required is switched out of the process chamber and a nonreactive gas flow of an equal, constant rate is simultaneously switched into the process chamber to maintain the overall constant flow and pressure therein. Where a number of reactive gas flows are used in a deposition process, the reactive gases required for a specific layer are switched into the process chamber and the non-required reactive gases are diverted out of the process chamber, preferably to the vent chamber. A diverted reactive gas flow is replaced by a compensating nonreactive gas flow and an added reactive gas flow replaces an equal nonreactive gas flow so that the overall flow remains constant as different combinations of reactive gases are switched into the process chamber during the deposition process.

The foregoing and other objects, features, and advantages of the invention will become more apparent from the following detailed description of the preferred embodiments which proceeds with reference to the accompanying drawings.

DETAILED DESCRIPTION

The Apparatus

Figure 1:
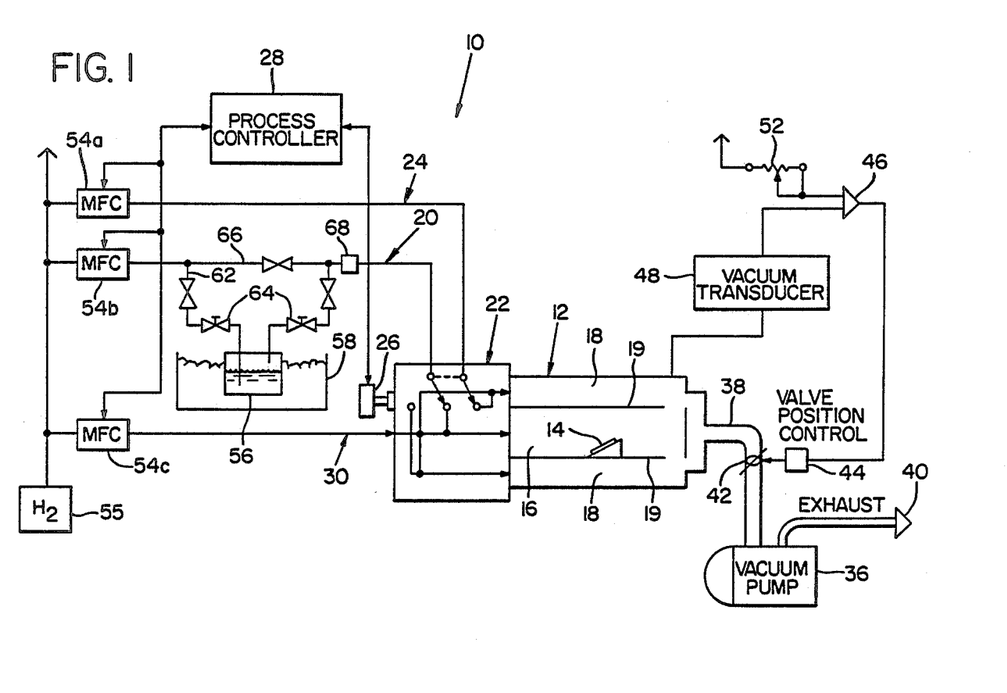
FIG. 1 is a schematic diagram of a chemical vapor deposition apparatus according to the invention.

FIG. 1 is a schematic diagram of a system or apparatus 10 according to the invention for depositing materials onto a substrate. The apparatus 10 includes an apparatus body 12 that houses a substrate 14 on which epitaxial layers are grown according to a number of known processes, such as metalorganic chemical vapor deposition (MOCVD). The body 12 comprises a process or reaction chamber 16 and a vent chamber 18 disposed annularly around the process chamber and separated from the process chamber and substrate 14 by partitions 19 of an inert material. The deposited materials that form the epitaxial layers on the substrate 14 are carried as reactive gases from a plurality of gas sources such as a source 20 that injects a gas flow into the body 12 through a manifold 22. A second, nonreactive gas represented by a source 24 also injects a gas flow into the body 12 through the manifold 22. The gas source 20 shown is derived by bubbling a carrier gas through a liquid source. Alternatively, the source 20 may represent any of a number of reactive gas sources such as a gaseous or "hydride" type source that does not require a metalorganic bubbler and bath described below.

The gas flows from these sources 20 and 24 are switched between the process chamber 16 and the vent chamber 18 by an inlet valve 26 monitored and controlled by a process controller 28 such as a conventional microcomputer. As indicated schematically in FIG. 1, the valve 26 switches the nonreactive gas flow from source 24 into one of the chambers 16, 18 while simultaneously switching the reactive gas flow from source 20 into the other of the chambers. Process controller 24 matches the flow of the nonreactive gas to the flow of the reactive gas so that the flow through each valve 26 into the process chamber 16 remains constant as gases are switched throughout the deposition process. The nonreactive flow also serves to purge the manifold 22 of reactive gas lingering therein. Any number of valves 26 with associated gas sources 20, 24 can be installed within the manifold 22, a single valve 26 shown in FIG. 1 only for purposes of illustration.

The gas flows into the process chamber 16 and vent chamber 18 are supplemented by a carrier gas flow from a source 30 that carries the reactive and nonreactive gas flows into the chambers. The carrier gas is preferably nonreactive and can flow at any rate, provided the rate is constant. If the vent and process chambers are of equal volumes, then the carrier gas flow into each chamber is substantially equal. If the two chambers are of different volumes, then the carrier flows for each chamber are adjusted accordingly to yield equal pressures within the chambers 16, 18.

The level of pressure within the two chambers 16 and 18 is controlled by a vacuum pump 36 connected to a common outlet 38. The pump 36 evacuates the chamber gases to an exhaust 40. The chambers 16 and 18 are joined within the body 12 upstream of the outlet 38 to aid in equalizing pressures within the chambers. The suction of the pump 36 is set by a throttle valve 42 within the outlet 38. Setting of the valve 42 in turn is controlled by a position control 44 that receives a control signal from a comparator 46. The comparator 46 compares the pressure within the process chamber 16, sensed by a vacuum transducer 48 such as a capacitance manometer, against an adjustable reference source 52. The comparator 46 generates the control signal continuously for positioning control 44 to maintain the pressure within the chamber 16 at the reference level.

Considering the makeup of the gas sources in more detail, the flows of gas from each gas source 24, 20, and 30 are controlled by conventional mass flow controllers 54a through 54c under the direction of the process controller 28, as will be described in the method of operation. The gas sources 24 and 30 each provide a flow of nonreactive gas such as hydrogen from a source 55. In FIG. 1, the gas source 20 represents a gaseous reactant or a metalorganic compound through which a hydride carrier gas such as hydrogen is bubbled to inject the compound in vapor form into the process chamber 16. The compound is contained in a bubbler comprising a stainless steel ampule 56 immersed in a conventional temperature-controlled recirculating bath 58 which controls precisely the vapor pressure of the immersed compound. A feed line 62 into and out of the ampule 56 contains a series of valves 64 for stopping the flow of gas when the ampule is to be changed. The gas source 20 also includes in line 66 a back-pressure regulator 68 to maintain a constant pressure within the ampule as pressures elsewhere within the apparatus 10 vary during the deposition process. The pressure within the ampule 56 is preferably maintained at approximately atmospheric pressure to prevent the formation of large bubbles that could disrupt the reactive gas flow.

Figure 2:
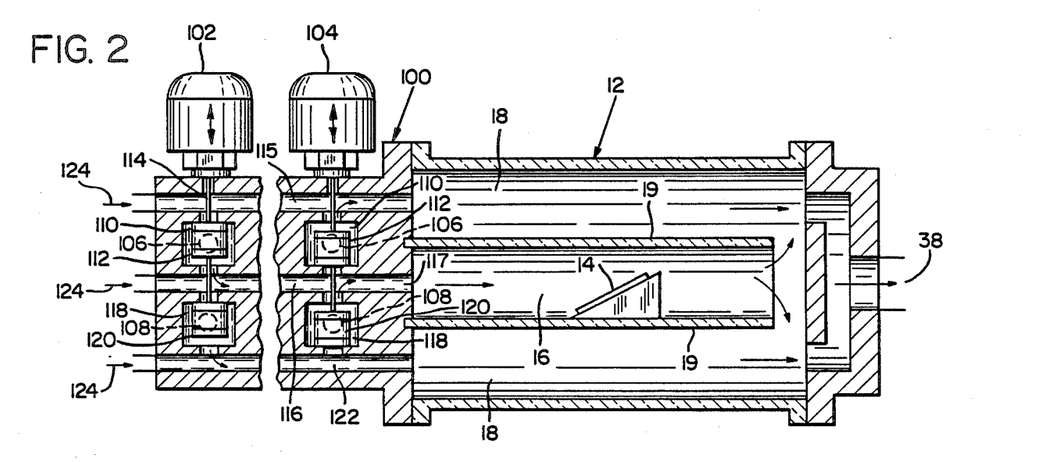
FIG. 2 is a cross-sectional view of a first embodiment of a manifold and apparatus body employed in the apparatus of FIG. 1.

FIG. 2 shows a cross-sectional view of a first embodiment of the manifold 22 of FIG. 1, labeled manifold 100 in FIG. 2, in communication with the apparatus body 12. A plurality of bellows switching valves 102, 104 are mounted in the linear manifold 100. Associated with each valve are first and second manifold inlets 106 and 108 for receiving gas flows from the reactive gas source 20 and nonreactive gas source 24, respectively. Inlet 106 connects to a valve cavity 110 containing a valve member 112 mounted to a reciprocable actuating rod 114. The member 112 switches the reactive gas flow between a first outlet to a vent path 115 and vent chamber 18 and a second outlet to a process path 116. The path 116 connects to a manifold outlet 117 to the process chamber 16. Similarly, the inlet 108 connects to a second valve cavity 118 which contains a second valve member 120 that is also connected to the common actuating rod 114. The valve members 112 and 120 are jointly operable by rod 114. The valve member 120 also switches the nonreactive gas flow between a first outlet to a second vent path 122 and the chamber 18 and a second outlet to the process path 116 and the chamber 16.

These reactive and nonreactive gas flows into the process chamber and vent chamber are mutually exclusive. For example, the valve 102 is shown in a first position, with the associated valve member 112 seated for directing the reactive gas flow through inlet 106 into the process path 116, as indicated by the arrow in the process path. The associated valve member 120 is seated for directing the nonreactive gas flow through inlet 108 into the vent path 122, as indicated by the arrow in the vent path. Valve 104 is shown in a second position, with the associated member 112 seated for directing the reactive gas flow from the associated inlet 106 into the vent path 115 and the associated valve member 120 seated for directing the nonreactive gas flow from the associated inlet 108 into the process path 116. With equal flow rates for each pair of reactive and nonreactive gas flows associated with each valve 102 and 104, the gas flows into the process chamber and vent chamber are constant as the reactive gas flows and nonreactive gas flows are switched back and forth between chambers during the deposition process. The nonreactive gas flow also purges the "dead space" within the manifold 100, consisting of the length of the second outlet of each valve cavity 110 and the portion of the process path 116 downstream of the valves 102 and 104, of any reactive gas that can linger therein after the reactive gas flow is switched to the vent path 115.

FIG. 2 also shows carrier gas flows indicated by arrows 124 for directing the carrier gas into the vent paths 115, 122 and process path 116. With both chambers 16, 18 of equal volume, equal pressures therein can be maintained by sending equal carrier gas flows into each chamber. If the process and vent chambers are of different volumes, the carrier gas flows to each chamber are set accordingly to yield equal pressures.

The annular relationship of the vent chamber 18 surrounding the process chamber 16 is shown in detail in FIG. 2. Both chambers communicate at the common downstream outlet 38 to equalize substantially the pressures within the two chambers.

In the process of depositing various types of materials on the substrate 14, the valves 102 and 104 are actuated in a predetermined sequence to switch reactive gas flows back and forth between the vent path 115 and process path 116. The reactive gases that flow simultaneously into the process chamber 12 combine in the chemical vapor deposition process to deposit layers of different composition on the substrate. Any reactive gas that would otherwise linger in the "dead space" of process path 116 after the reactive flow is switched to the vent path 115 is immediately swept into the process chamber 16 by the nonreactive gas flow from inlets 108. The thickness and transitions of the different epitaxial layers can thus be more precisely controlled than in a conventional apparatus, where reactive gases continue to seep from the "dead space" into the process chamber after their flows have been terminated.

Figure 3:
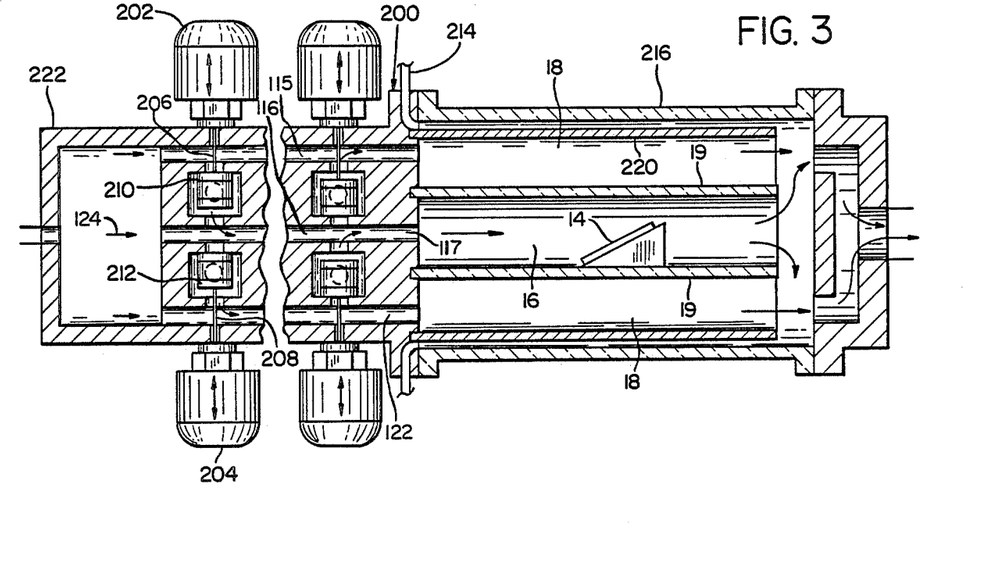
FIG. 3 is a cross-sectional view of a second embodiment of the manifold of FIG. 1.

A second embodiment of the manifold 22 of FIG. 1, labeled manifold 200, is shown in cross section in FIG. 3. In contrast to the embodiment of FIG. 2, each inlet valve is broken into a pair of jointly operable valves 202 and 204. Each valve 202, 204 has a separate actuating rod 206, 208 with a connected valve member 210, 212. The valves 202, 204 are activated simultaneously by controller 28 to switch either the reactive gas flow or nonreactive gas flow into the process chamber 16 and the other of the flows into the vent chamber 18, as indicated by the arrows. The use of separate valves 202, 204 is illustrated because in practice it may be difficult to seat the two valve members 112 and 120 together properly in FIG. 2 if they are connected to a single actuating rod. The improper seating can cause a leakage of reactive gas into the process chamber 16 and result in a contaminated deposition layer.

FIG. 3 also illustrates the use of a skirt purge line 214 for directing a nonreactive gas between the exterior wall 216 of the apparatus body 12 and the outer quartz wall 220 of the vent chamber 18. This purging gas prevents the reactive gases from depositing material on the exterior wall 214. At the other end of the apparatus body 12, a common carrier manifold 222 is shown connected to the manifold 200. The manifold 222 directs equal carrier gas flows to each of the vent paths 115, 122 and the process path 116.

Figure 4:
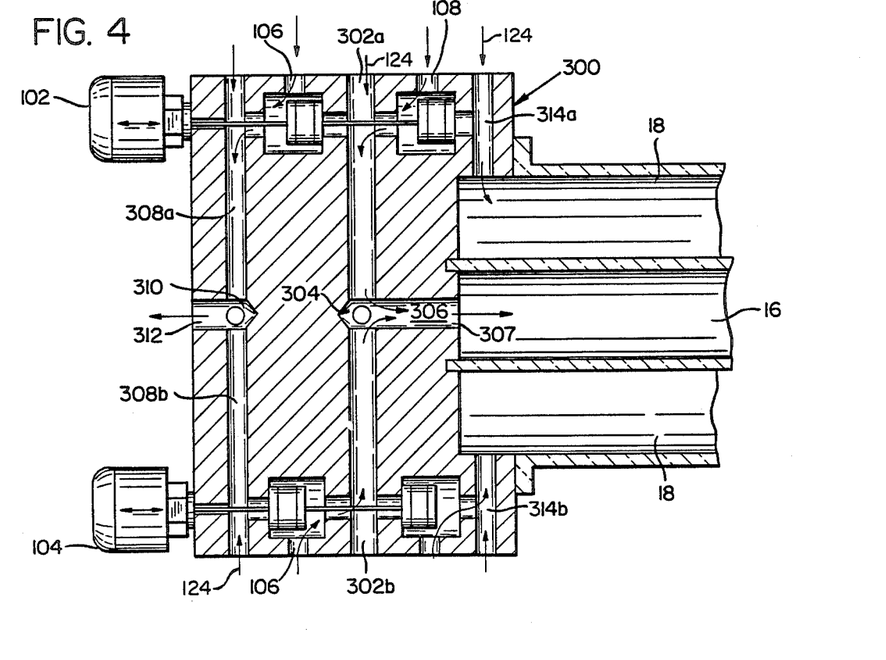
FIG. 4 is a cross-sectional view of a third embodiment of the manifold of FIG. 1.

Although the problem of "dead space" within the manifold 22 is virtually eliminated by the use of a nonreactive or purging gas flow from inlets 108 in FIG. 2, the actual space between each valve 102, 104 and the process chamber 16 is different in a linear manifold such as the manifold 100 of FIG. 2 or 200 of FIG. 3 because of the varying distances of the valves 102, 104 from the manifold outlet 117. This difference in space results in different volumes of reactive gas being swept into the process chamber 16 during the deposition process. To equalize these volumes, valves 102, 104, etc., may be mounted in a radial arrangement. Referring to FIG. 4, such an arrangement is shown in a third embodiment of the manifold 22 of FIG. 1 as a radial manifold 300. Process paths 302a, 302b from each valve 300 are of equal length and extend radially inward of the manifold 300 to meet at a common location 304. A common axial outlet path 306 extends from the location 304 through a manifold outlet 307 to the process chamber 16. Vent paths 308a, 308b also extend radially inward of the manifold 300 to converge at a common location 310. A common axial vent path 312 extends axially of the manifold 300 and connects to an external conduit (not shown) which circles around the manifold 300 to join vent paths 314a, 314b that enter opposite sides of the vent chamber 18.

FIG. 4 shows a reactive gas flow entering through the inlet 106 to valve 102 and being diverted to the vent path 308a and a nonreactive gas flow entering the inlet 108 to valve 102 and being diverted to the process path 302a. A second reactive gas flow is shown entering the inlet 106 to valve 104 and being diverted to the process path 302b, with a second nonreactive gas flow entering the inlet 108 to valve 104 and being diverted to the vent path 314b. With equal flows of reactive and nonreactive gas through each inlet 106, 108, the flows into the process chamber 16 and vent chamber 18 through each inlet valve 102, 104 remain constant as reactive gases are switched between the two chambers and thus the total flow into the chambers remains constant.

Figure 5:
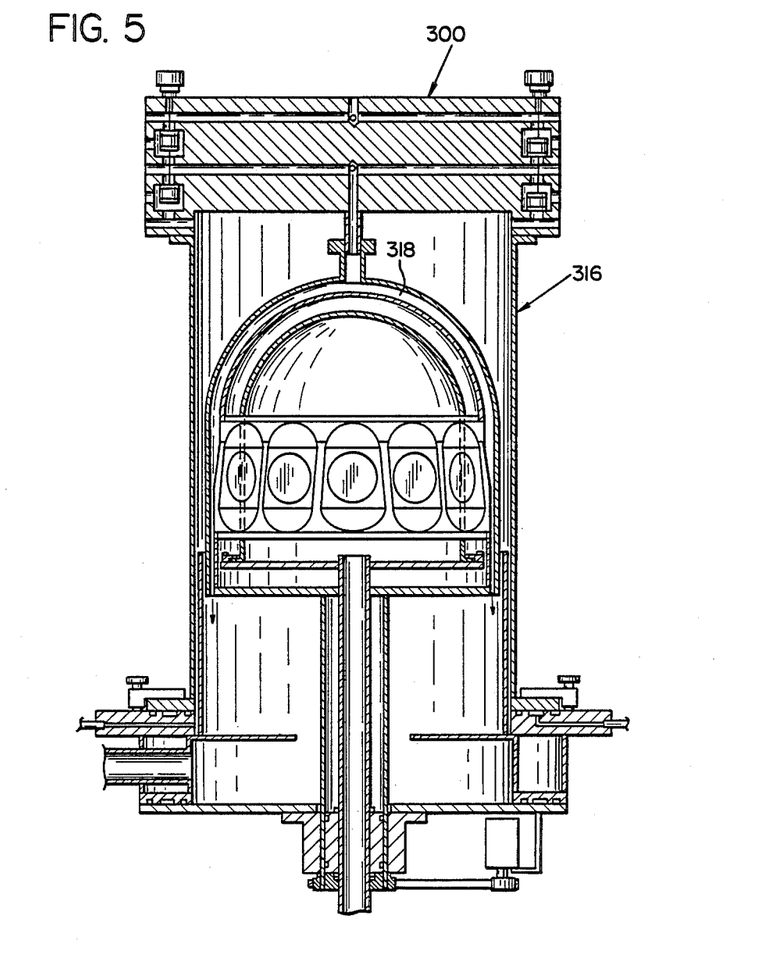
FIG. 5 is a cross-sectional view of the manifold of FIG. 4 connected to a vertical apparatus body.

A manifold 22 of any of the various embodiments of FIGS. 2 through 4 can be used with vertical as well as horizontal process chambers. Referring to FIG. 5, the radial manifold 300 of FIG. 4 is shown mounted to a vertical apparatus body 316 that includes a vertical process chamber 318. The operation of a vertical process chamber is described in the cross-referenced U.S. patent application Ser. No. 873,581, entitled METHOD AND APPARATUS FOR DEPOSITING MATERIAL ON A SUBSTRATE, and similarly described in U.S. Pat. No. 4,446,817.

The Method of Operation

The method of operation employed by the apparatus 10 minimizes "dead space" in the manifold 22 and equalizes the pressures within the process and vent chambers 16 and 18. This makes it possible to produce epitaxial layers with sharp transitions and of extremely narrow thickness. Such layers are combined in structures such as laser diodes, optoelectronic devices, and high electron mobility transistors (HEMTs). As is clear from the apparatus description, equal pressures are achieved by maintaining constant gas flows through each inlet valve 26 into the process chamber 16 and the vent chamber 18 as the reactive gases from a gas source 20 are switched into and out of the process chamber. With a pressure equal to the pressure of the process chamber 16, the vent chamber 18 acts as a pressure damping reservoir to minimize disturbances in the reactive gas flow. Although the gas flow rate should be constant in each chamber 16 and 18 to maintain equal pressure, they need not be equal. The actual flow in each chamber may be different so long as the chamber geometries produce equal pressures.

Figure 6:
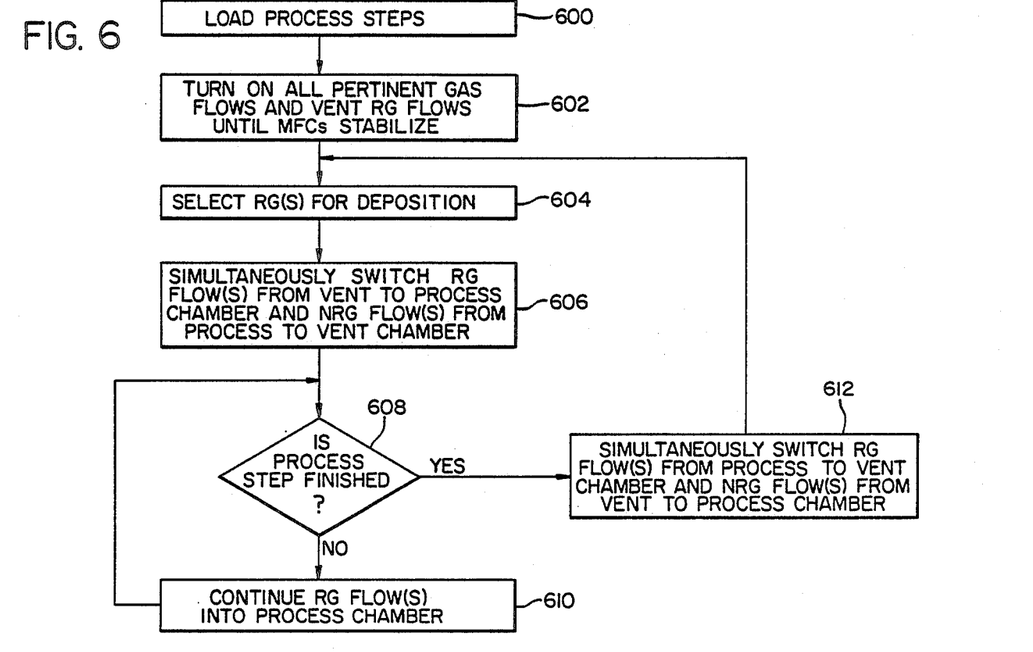
FIG. 6 is a flowchart of a deposition procedure illustrating the method of the invention.

Referring to FIG. 6, a flowchart illustrating the method of operation is shown. This flowchart illustrates the procedure taken by the process controller 28 to carry out a deposition run. The process controller 28 may be of any number of commercially available controllers or microcomputers such as an IBM PC or HP 9836 programmed in suitable fashion.

Initially, the process steps to be carried out are loaded and stored in the controller 28 (box 600). All pertinent gas flows, both reactive (RG), nonreactive (NRG), and carrier (CG) are turned on, with the reactive flows vented to the vent chamber 18 until the MFCs 54a through 54c stabilize (box 602). The flow through the process chamber 16 is adjusted until the desired constant total flow and pressure for the particular deposition is reached. The carrier gas flows into the process and vent chambers 16, 18 are adjusted accordingly at MFC 54c to produce equal pressures therein.

The first process step is initiated by selecting the desired reactive gas flows for the first deposition layer (box 604). One or more reactive gas flows, which can flow at different predetermined rates that depend on the particular deposition, are then switched into the process chamber 16 to produce a deposition reaction. The associated nonreactive gas flow through each affected valve 26 is simultaneously switched to the vent chamber 18 (box 606). The total gas flow into the process chamber 16 is maintained at a constant rate by maintaining a constant flow per valve. The deposition in the first process step continues until the step is completed as determined by process controller 28 (boxes 608, 610).

Once the first process step is finished, those reactive gas flows not required in the next step are switched to vent and the associated nonreactive gas flow simultaneously switched into the process chamber (box 612). This process step and following steps proceed like the first, with the required reactive gas flows selected (box 604) and switched into the process chamber 16 (box 606) and the nonreactive gas flows switched to the vent chamber 18.

It should be understood that many of the steps shown and described as discrete can occur simultaneously or be carried out in principle by other means so long as the constant total flows and thus the constant pressures are maintained in each chamber 16 and 18.

Figure 7:
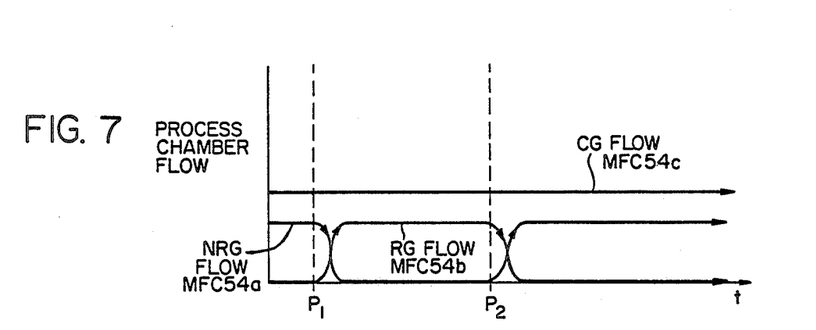
FIG. 7 is a graph illustrating gas flow through one valve of the manifold into the process chamber.
Figure 8:
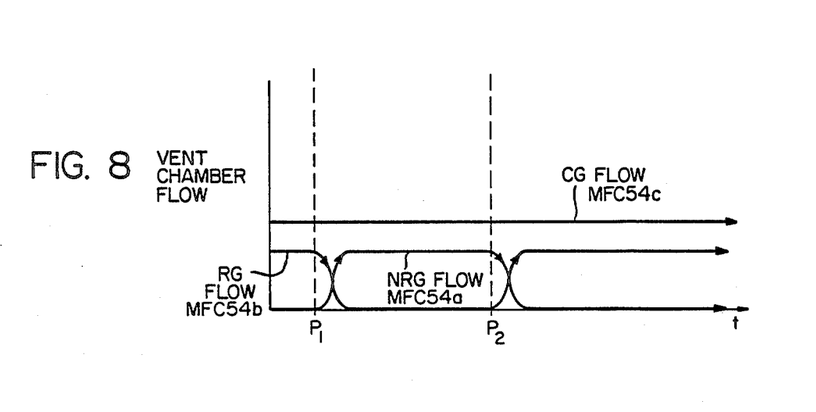
FIG. 8 is a graph illustrating gas flow through one valve of the manifold into the vent chamber.

An example of how the gas flows can change yet maintain a constant total flow into the process and vent chambers is illustrated by the relative flow rates in FIGS. 7 and 8 for an associated pair of reactive and nonreactive gas flows through a single valve 26. Before the deposition process begins, the reactive gas flow is vented and the entire process chamber flow is nonreactive gas. At the first process step, P1, the reactive gas flow is switched into the chamber 16 and out of the vent chamber 18. Simultaneously, the associated nonreactive gas flow is switched from the vent chamber 18 into the process chamber 16. At the second process step, P2, the reactive gas flow is switched from the process chamber 16 into the vent chamber 18. Simultaneously, the nonreactive gas flow is switched from the vent chamber 18 into the process chamber 16. Because the reactive and nonreactive flows are equal, the flow through valve 26 into each chamber 16, 18 remains constant. The carrier gas flow is maintained constant throughout the process. No substantial pressure fluctuations occur in switching gas flows between chambers because the pressures are maintained constant and equal in both chambers. This example is not intended to limit the invention but merely to show that simultaneously switching equal flows of reactive and nonreactive gas through each valve 26 maintains a constant total flow and thus constant pressure within the process and vent chambers.

In actual practice, this method and apparatus 10 should produce depositions as thin as 50 angstroms, with heterojunction transition thicknesses as thin as 10 angstroms in low pressure operation and 25 angstroms in atmospheric pressure operation.

Having illustrated and described the principles of the invention in the preferred embodiments, it should be apparent to those skilled in the art that the invention can be modified in arrangement and detail without departing from such principles. I claim all modifications coming within the spirit and scope of the following claims.

I claim:

1. An apparatus for depositing material on a substrate, comprising:
    a process chamber;
    a plurality of gas sources each providing a gas flow;
    manifold means for directing gases selectively from the gas sources to the process chamber, the manifold means having first and second inlets for receiving gases from the gas sources, an outlet to the process chamber in communication with the inlets, and a vent in communication with the inlets; and
    inlet valve means within the manifold means and operable for directing the gas flow through the first manifold inlet to the outlet and through the second manifold inlet to the vent and for simultaneously switching the gas flows through the inlets back and forth between the outlet and the vent.

2. The apparatus of claim 1 including a vent chamber annularly disposed around the process chamber and in communication with the process chamber at a common outlet to equalize pressure within the chambers.

3. The apparatus of claim 1 in which the valve means comprises a valve having a first position for directing gas flow from the first inlet to the outlet and gas flow from the second inlet to the vent and a second position for directing gas flow from the first inlet to the vent and gas flow from the second inlet to the outlet.

4. The apparatus of claim 3 including means for purging the manifold of gas from the first inlet.

5. The apparatus of claim 4 in which the purging means comprises a gas source directing a gas flow from the second manifold inlet along a flow path through the manifold common with the gas flow from the first inlet.

6. The apparatus of claim 1 including means for maintaining a constant gas flow into the process chamber as the gas flows from the inlets are switched between the outlet and the vent.

7. The apparatus of claim 6 in which the constant flow means comprises gas sources providing equal gas flows to the first and second inlets 8. The apparatus of claim 1 in which the valve means includes a cavity within the manifold means in communication with each of the first and second inlets, the vent, and the outlet.

9. The apparatus of claim 1 in which the inlet valve means comprises separate valves acting in cooperation to provide the first and second valve positions.

10. The apparatus of claim 1 in which the valve means comprises a plurality of valves each with associated first and second inlets, each valve located equidistantly from the manifold outlet.

11. The apparatus of claim 1 in which each inlet is in communication with the outlet at a common location.

12. The apparatus of claim 1 in which the manifold means comprises a radial manifold, the inlets extending radially through the manifold to communicate with the outlet at a common location, the outlet extending axially therefrom within the manifold.

13. The apparatus of claim 1 including means for injecting a carrier gas into the vent and the outlet to maintain equal pressures within the process chamber and the vent.

14. The apparatus of claim 1 including a skirt purge line surrounding the process chamber for directing a purging gas over the process chamber to prevent the deposit of material on the chamber walls.

15. An apparatus for depositing material on a substrate, comprising:
    a process chamber;
    a plurality of gas sources each providing a gas flow;
    a manifold for directing gases selectively from the gas sources to the reaction chamber, the manifold having a plurality of first and second inlet pairs for receiving gases from the gas sources, an outlet in communication with the inlet pairs, and a vent in communication with the inlet pairs;
    a valve within the manifold between each inlet pair and the outlet and vent directing the gas flow from one manifold inlet of a pair to the outlet and from the other inlet of the pair to the vent and for simultaneously switching the gas flows back and forth between the outlet and vent to maintain a constant gas flow through the process chamber; and a vent chamber in communication with a vent path; and means for injecting a gas flow into the vent chamber and the process chamber to equalize and maintain constant pressures within the chambers as the gas flows through each inlet of a pair are switched by the valve between the vent to the vent chamber and the outlet to the process chamber.

* * * * *